(12) United States Patent
Zhao et al.

(10) Patent No.: US 10,127,864 B2
(45) Date of Patent: Nov. 13, 2018

(54) CIRCUIT STRUCTURE, DISPLAY DEVICE AND DRIVING METHOD

(71) Applicant: BOE TECHNOLOGY GROUP CO., LTD., Beijing (CN)

(72) Inventors: Hui Zhao, Beijing (CN); Libin Liu, Beijing (CN); Lei Hu, Beijing (CN); Wenjing Tan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/552,409

(22) PCT Filed: Mar. 29, 2017

(86) PCT No.: PCT/CN2017/078527
§ 371 (c)(1),
(2) Date: Aug. 21, 2017

(87) PCT Pub. No.: WO2018/032769
PCT Pub. Date: Feb. 22, 2018

(65) Prior Publication Data
US 2018/0247596 A1 Aug. 30, 2018

(30) Foreign Application Priority Data
Aug. 19, 2016 (CN) .......................... 2016 1 0698311

(51) Int. Cl.
*G09G 5/10* (2006.01)
*G09G 3/3291* (2016.01)
(Continued)

(52) U.S. Cl.
CPC .......... *G09G 3/3291* (2013.01); *G09G 3/3233* (2013.01); *H05K 1/18* (2013.01);
(Continued)

(58) Field of Classification Search
CPC .. G09G 3/30; G09G 3/3046; G09G 2320/045; G09G 3/3233
(Continued)

(56) References Cited

U.S. PATENT DOCUMENTS 8,310,417 B2 11/2012 Choi
9,626,893 B2 4/2017 Kim
(Continued)

FOREIGN PATENT DOCUMENTS

CN 101533851 A 9/2009
CN 101593767 A 12/2009
(Continued)

OTHER PUBLICATIONS

International Search Report of PCT/CN2017/078527 in Chinese, dated Jun. 7, 2017 with English translation.
(Continued)

*Primary Examiner* — Yuzhen Shen
(74) *Attorney, Agent, or Firm* — Collard & Roe, P.C.

(57) ABSTRACT

A circuit structure includes: a control circuit, including a first end, a second end and a control end; a switching circuit, including a first interface, a second interface and a control interface; a driving power line, connected with the control end of the control circuit and configured to provide a driving power voltage in a working stage to conduct the first end of the control circuit and the second end of the control circuit; and a first voltage line, connected with the first end of the control circuit and configured to, when the first end of the control circuit and the second end of the control circuit are conducted, provide a first voltage to the control interface of the switching circuit through the control circuit to disconnect the first interface of the switching circuit from the second interface of the switching circuit.

20 Claims, 4 Drawing Sheets

(51) Int. Cl.
*G09G 3/3233* (2016.01)
*H05K 1/18* (2006.01)

(52) U.S. Cl.
CPC ............... *G09G 2310/0289* (2013.01); *G09G 2320/0204* (2013.01); *G09G 2330/026* (2013.01); *H05K 2201/1003* (2013.01)

(58) Field of Classification Search
USPC .......................................................... 345/76
See application file for complete search history.

(56) References Cited

U.S. PATENT DOCUMENTS

| | | | |
|---|---|---|---|
| 2004/0227704 A1 | 11/2004 | Wang et al. | |
| 2006/0071884 A1* | 4/2006 | Kim | G09G 3/3233 345/76 |
| 2006/0139255 A1* | 6/2006 | Kim | G09G 3/3233 345/76 |
| 2006/0170628 A1* | 8/2006 | Yamashita | G09G 3/3233 345/76 |
| 2009/0295772 A1 | 12/2009 | Kim et al. | |
| 2014/0049568 A1* | 2/2014 | Qi | G09G 3/3258 345/690 |
| 2014/0111562 A1* | 4/2014 | Wu | G09G 3/3233 345/690 |
| 2015/0002432 A1* | 1/2015 | Tan | G09G 3/3258 345/173 |
| 2017/0229067 A1* | 8/2017 | Uchino | G09G 3/3233 |

FOREIGN PATENT DOCUMENTS

| | | |
|---|---|---|
| CN | 203325407 U | 12/2013 |
| CN | 104282262 A | 1/2015 |
| CN | 106097963 A | 11/2016 |

OTHER PUBLICATIONS

Notice of Transmittal of the International Search Report of PCT/CN2017/078527 in Chinese, dated Jun. 7, 2017.

Written Opinion of the International Searching Authority of PCT/CN2017/078527 in Chinese, dated Jun. 7, 2017 with English translation.

* cited by examiner

US 10,127,864 B2

CIRCUIT STRUCTURE, DISPLAY DEVICE AND DRIVING METHOD

CROSS REFERENCE TO RELATED APPLICATIONS

This application is the National Stage of PCT/CN2017/078527 filed on Mar. 29, 2017, which claims priority under 35 U.S.C. § 119 of Chinese Application No. 201610698311.9 filed on Aug. 19, 2016, the disclosure of which is incorporated by reference.

TECHNICAL FIELD

Embodiments of the present disclosure relate to a circuit structure, a display device and a driving method of the circuit structure.

BACKGROUND

In the field of display, Organic Light Emitting Diode (OLED) display panels have characteristics of self-luminescence, high contrast, small thickness, a wide viewing angle, a high response speed, capability of being used in flexible panels, a wide use temperature range, simplicity for manufacturing and the like. The OLED display panels have a wide development prospect.

Due to the above characteristics, the OLED display panels may be applicable in apparatuses with a display function, e.g., a mobile phone, a display, a notebook computer, a digital camera, an instrument and the like.

SUMMARY

Embodiments of the disclosure provide a circuit structure, comprising: a control circuit, including a first end, a second end and a control end; a switching circuit, including a first interface, a second interface and a control interface, wherein the control interface of the switching circuit is connected with the second end of the control circuit, and the second interface of the switching circuit is grounded; a data-line group, connected with the first interface of the switching circuit; a driving power line, connected with the control end of the control circuit and configured to provide a driving power voltage in a working stage to conduct the first end of the control circuit and the second end of the control circuit; and a first voltage line, connected with the first end of the control circuit and configured to, when the first end of the control circuit and the second end of the control circuit are conducted, provide a first voltage to the control interface of the switching circuit through the control circuit to disconnect the first interface of the switching circuit from the second interface of the switching circuit.

For example, the data-line group is further connected with a pixel circuit in a display panel, and the driving power voltage is further configured to drive an organic light emitting diode in the pixel circuit of the display panel to emit light in the working stage.

For example, the circuit structure further comprises a first resistor, wherein the second interface of the switching circuit is connected with a first end of the first resistor, and a second end of the first resistor is grounded, so that the switching circuit is grounded through the first resistor.

For example, the circuit structure further comprises a second resistor, wherein a first end of the second resistor is simultaneously connected with the control interface of the switching circuit and the second end of the control circuit, and a second end of the second resistor is grounded.

For example, the circuit structure further comprises a diode, wherein a first end of the diode is connected with the control end of the control circuit, and a second end of the diode is connected with the driving power line, so that the driving power line is connected with the control end of the control circuit through the diode.

For example, the switching circuit includes a first transistor, and the first interface, the second interface and the control interface of the switching circuit respectively include a first electrode, a second electrode and a gate electrode of the first transistor; the control circuit includes a control transistor, and the first end, the second end and the control end of the control circuit respectively include a first electrode, a second electrode and a gate electrode of the control transistor; the data-line group includes a first data line; the first electrode of the first transistor is connected with the first data line, the gate electrode of the first transistor is connected with the second electrode of the control transistor, and the second electrode of the first transistor is grounded; and the first electrode of the control transistor is connected with the first voltage line, and the gate electrode of the control transistor is connected with the driving power line.

For example, the switching circuit includes a first transistor, a second transistor and a third transistor, the first interface of the switching circuit includes a first electrode of the first transistor, a first electrode of the second transistor and a first electrode of the third transistor, the second interface of the switching circuit includes a second electrode of the first transistor, a second electrode of the second transistor and a second electrode of the third transistor, and the control interface of the switching circuit includes a gate electrode of the first transistor, a gate electrode of the second transistor and a gate electrode of the third transistor; the control circuit includes a control transistor, and the first end, the second end and the control end of the control circuit respectively include a first electrode, a second electrode and a gate electrode of the control transistor; the data-line group includes a first data line, a second data line and a third data line; the first electrode of the first transistor is connected with the first data line, the gate electrode of the first transistor is connected with the second electrode of the control transistor, and the second electrode of the first transistor is grounded; the first electrode of the second transistor is connected with the second data line, the gate electrode of the second transistor is connected with the second electrode of the control transistor, and the second electrode of the second transistor is grounded; the first electrode of the third transistor is connected with the third data line, the gate electrode of the third transistor is connected with the second electrode of the control transistor, and the second electrode of the third transistor is grounded; and the first electrode of the control transistor is connected with the first voltage line, and the gate electrode of the control transistor is connected with the driving power line.

For example, the first transistor, the second transistor, the third transistor and the control transistor are thin film transistors.

For example, the first transistor, the second transistor and the third transistor are P-type transistors, and the control transistor is an N-type transistor.

For example, the circuit structure further comprises a first resistor, a first test pad, a second test pad and a third test pad, wherein: the first test pad is connected with the second electrode of the first transistor and a first end of the first resistor; the second test pad is connected with the second electrode of the second transistor and the first end of the first resistor; the third test pad is connected with the second electrode of the third transistor and the first end of the first resistor; and a second end of the first resistor is grounded.

For example, the circuit structure further comprises a third resistor, a fourth resistor, a fifth resistor, a first test pad, a second test pad and a third test pad, wherein: the first test pad is connected with the second electrode of the first transistor and a first end of the third resistor; the second test pad is connected with the second electrode of the second transistor and a first end of the fourth resistor; the third test pad is connected with the second electrode of the third transistor and a first end of the fifth resistor; and a second end of the third resistor, a second end of the fourth resistor and a second end of the fifth resistor are grounded.

For example, the circuit structure further comprises: a first pin, a second pin, a third pin, a fourth pin, a fifth pin connected with the first pin, a sixth pin connected with the second pin, a seventh pin connected with the third pin, and an eighth pin connected with the fourth pin, wherein: the first pin is connected with the second electrode of the first transistor; the second pin is connected with the second electrode of the second transistor; the third pin is connected with the second electrode of the third transistor; the fourth pin is connected with the gate electrode of the first transistor, the gate electrode of the second transistor and the gate electrode of the third transistor; the fifth pin, the sixth pin and the seventh pin are grounded; and the eighth pin is connected with the second electrode of the control transistor.

Embodiments of the disclosure further provide a display device, comprising the circuit structure described above.

For example, the display device comprises a display panel and a circuit board, wherein the circuit structure is arranged on the display panel or the circuit board.

For example, the display device comprises a display panel and a circuit board, wherein a first portion of the circuit structure is arranged on the display panel, a second portion of the circuit structure is arranged on the circuit board, the first portion of the circuit structure includes the switching circuit and the data-line group, and the second portion of the circuit structure includes the control circuit.

For example, the first portion of the circuit structure and the second portion of the circuit structure are connected through a plurality of pins arranged in a bonding region.

For example, the display panel includes a driving circuit, and the driving circuit is configured to provide a first voltage to the first voltage line.

For example, the circuit board includes a direct current transformer, and the direct current transformer is respectively connected with the driving circuit and the driving power line and is configured to provide the driving power voltage to the driving power line.

Embodiments of the disclosure further provides a method for driving the circuit structure described above, comprising: in an initial stage, conducting the first interface of the switching circuit and the second interface of the switching circuit, so that the data-line group is grounded through the switching circuit; and in a working stage, disconnecting the first interface of the switching circuit from the second interface of the switching circuit.

For example, in the initial stage, conducting the first interface of the switching circuit and the second interface of the switching circuit includes: disconnecting the first end of the control circuit from the second end of the control circuit to control a voltage applied to the control interface of the switching circuit to be a switch opening voltage, wherein under control of the switch opening voltage, the first interface of the switching circuit and the second interface of the switching circuit are conducted, so that the data-line group is grounded through the switching circuit. In the working stage, disconnecting the first interface of the switching circuit from the second interface of the switching circuit includes: conducting the first end of the control circuit and the second end of the control circuit so as to provide a first voltage to the control interface of the switching circuit, wherein under control of the first voltage, the switching circuit disconnects the first interface of the switching circuit from the second interface of the switching circuit.

For example, in the initial stage, disconnecting the first end of the control circuit from the second end of the control circuit includes: providing a closing voltage to the control end of the control circuit so as to disconnect the first end of the control circuit from the second end of the control circuit. In the working stage, conducting the first end of the control circuit and the second end of the control circuit includes: providing a driving power voltage to the control end of the control circuit so as to conduct the first end of the control circuit and the second end of the control circuit.

BRIEF DESCRIPTION OF THE DRAWINGS

In order to illustrate the technical solutions in the embodiments of the present disclosure more clearly, the drawings needed to be used in the description of the embodiments will be briefly described in the following; it is obvious that the drawings described below are only related to some embodiments of the present disclosure, and not intended to be limitative to the disclosure.

REFERENCE SIGNS

Figure 1:
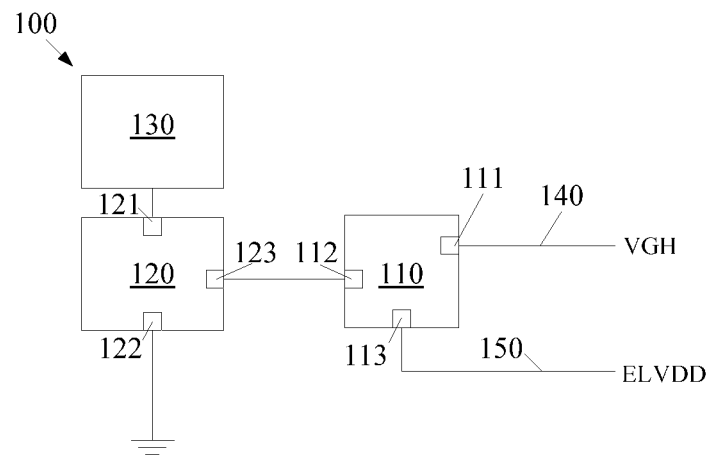
FIG. 1 is a first schematic diagram of a circuit structure provided by an embodiment of the present disclosure.

10—display device; 100—circuit structure; 101—first portion of circuit structure; 102—second portion of circuit structure; 110—control circuit; 111—first end of control circuit; 112—second end of control circuit; 113—control end of control circuit; 120—switching circuit; 121—first interface of switching circuit; 122—second interface of switching circuit; 123—control interface of switching circuit; 130—data-line group; 131—first data line; 132—second data line; 133—third data line; 140—first voltage line; 150—driving power line; 170—diode; 181—first test pad; 182—second test pad; 183—third test pad; 191—first pin; 192—second pin; 193—third pin; 194—fourth pin; 195—fifth pin; 196—sixth pin; 197—seventh pin; 198—eighth pin; 200—display panel; 210—pixel circuit; 220—driving circuit; 300—circuit board; 310—direct current transformer; VGH—first voltage; ELVDD—driving power voltage; OLED—organic light emitting diode; R1—first resistor; R2—second resistor; R11—third resistor; R12—fourth resistor; R13—fifth resistor; T1—first transistor; T2—second transistor; T3—third transistor; and TC—control transistor.

DETAILED DESCRIPTION

Hereafter, the technical solutions of the embodiments of the present disclosure will be described in a clearly and fully understandable way. With reference to the drawings that are described in details below, example and non-limitative embodiments and their various features and beneficial details are described in a more complete way. It is noted that features shown in the drawings are not shown with actual scales. Known materials, components and manufacture technologies are omitted in the disclosure, so as not to obscure the example embodiments of the disclosure. Examples provided herein only aim to be helpful for understanding implementation of the example embodiments of the disclosure, and further helpful for one skilled in the art to be able to implement the example embodiments. Thus, the examples should not be understood as limitation on scope of embodiments of the disclosure.

Unless otherwise clearly defined and limited, technical terms or scientific terms used in the disclosure should have ordinary meanings understood by persons having ordinary skills in the field of the disclosure. Terms such as "first," "second," or similar terms in the disclosure are not intended to represent any order, quantities or importance, but are used to distinguish different composing parts. In addition, in each embodiment of the disclosure, identical or similar reference numbers represent identical or similar elements.

An Organic Light Emitting Diode (OLED) display panel is a self-luminous display panel, and has the characteristics of high contrast, wide color gamut, a high response speed, low power consumption and the like. However, due to characteristics of pixel circuits and a driving circuit in the OLED display panel, part of products may have a splash screen phenomenon when being powered on, such that user experience is seriously influenced. For example, in an initial stage of powering on, due to difference of the pixel circuits, floating of an output signal of a driving circuit may exist, causing a scenario that switching transistors cannot be controllable completely and a scenario that light emission is uncontrollable being occurred in a display screen. Thus, user experience is seriously influenced. Currently, the problem can be solved by redesigning a powering-on sequence or modifying the driving circuit, which needs a long time and is unbeneficial to production of the products.

Embodiments of the disclosure provide a circuit structure, a display device and a driving method. By modifying a voltage on a data line before the display device operates normally, the powered-on splash screen phenomenon is avoided.

An embodiment of the present disclosure provides a circuit structure 100. As shown in FIG. 1, the circuit structure 100 may include: a control circuit 110, including a first end 111, a second end 112 and a control end 113; a switching circuit 120 including a first interface 121, a second interface 122 and a control interface 123, the control interface 123 of the switching circuit 120 being connected with the second end 112 of the control circuit 110, and the second interface 122 of the switching circuit 120 being grounded; a data-line group 130, connected with the first interface 121 of the switching circuit 120 and a pixel circuit (not shown in FIG. 1) in a display panel; a driving power line 150, connected with the control end 113 of the control circuit 110 and configured to provide a driving power voltage ELVDD in a working stage to conduct the first end 111 of the control circuit 110 and the second end 112 of the control circuit 110; and a first voltage line 140, connected with the first end 111 of the control circuit 110 and configured to, when the first end 111 of the control circuit 110 and the second end 112 of the control circuit 110 are conducted, provide a first voltage VGH to the control interface 123 of the switching circuit 120 through the control circuit 110 so as to disconnect the first interface 121 of the switching circuit 120 from the second interface 122 of the switching circuit 120.

Figure 2:
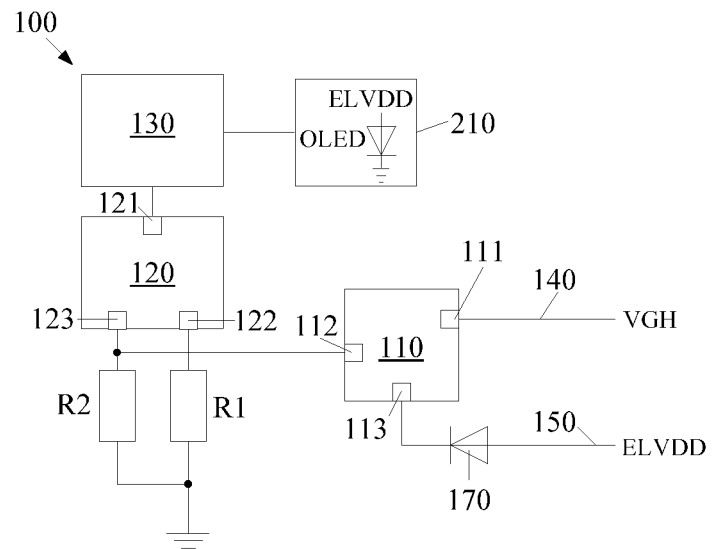
FIG. 2 is a second schematic diagram of a circuit structure provided by an embodiment of the present disclosure.

For example, as shown in FIG. 2, a pixel circuit 210 of the display panel is connected with the data-line group 130, and the driving power voltage ELVDD is further configured to drive an organic light emitting diode (OLED) in the pixel circuit 210 of the display panel to emit light during a working stage. In other words, the driving power voltage ELVDD provided on the driving power line 150 and used for conducting the first end 111 of the control circuit 110 and the second end 112 of the control circuit 110 is the same as the driving power voltage ELVDD for driving the organic light emitting diode in the pixel circuit 210 of the display panel to emit light during the working stage (e.g., the driving power voltages ELVDD have a same signal waveform).

For example, in an initial stage (i.e., a stage in which the organic light emitting diode in the pixel circuit 210 of the display panel does not emit light), the driving power voltage ELVDD is not generated (e.g., a voltage on the driving power line 150 is a closing voltage for disconnecting the first end 111 of the control circuit from the second end 112 of the control circuit). In this case, the first end 111 of the control circuit and the second end 112 of the control circuit are disconnected; a voltage of the control interface 123 of the switching circuit, for example, is a switch opening voltage for conducting the first interface 121 of the switching circuit and the second interface 122 of the switching circuit, and the first interface 121 of the switching circuit and the second interface 122 of the switching circuit are conducted. Therefore, the data-line group 130 is grounded through the switching circuit 120 so as to avoid abnormal light emission of the organic light emitting diode OLED. In the working stage (i.e., a stage in which the organic light emitting diode OLED in the pixel circuit 210 of the display panel needs to emit light), under the control of the driving power voltage ELVDD, the first end 111 of the control circuit and the second end 112 of the control circuit are conducted. Thus, the control interface 123 of the switching circuit receives the first voltage VGH through the control circuit 110, so that the control interface 123 of the switching circuit 120 disconnects the first interface 121 of the switching circuit from the second interface 122 of the switching circuit under the control of the first voltage VGH. Then, the organic light emitting diode OLED normally emits light according to a light emitting data signal provided by the data-line group, thereby avoiding the power-on splash screen phenomenon.

For example, as shown in FIG. 2, the circuit structure 100 provided by an embodiment of the present disclosure further includes a first resistor R1. The second interface 122 of the switching circuit 120 is connected with a first end of the first resistor R1, and a second end of the first resistor R1 is grounded, so that the switching circuit 120 is grounded through the first resistor R1. For example, the first resistor R1 can prevent influence of an excessively large current on the circuit when a signal on the data line is abnormal, leading to a current limiting effect and allowing the circuit to be more stable.

For example, as shown in FIG. 2, the circuit structure 100 provided by an embodiment of the present disclosure further includes a second resistor R2. A first end of the second resistor R2 is simultaneously connected with the control interface of the switching circuit 120 and the second end of the control circuit 110, and a second end of the second resistor R2 is grounded. For example, the control interface 123 of the switching circuit 120 is grounded through the second resistor R2, so that a voltage of the control interface 123 of the switching circuit 120 can be guaranteed to be a grounding voltage (e.g., 0V) when the first end 111 of the control circuit and the second end 112 of the control circuit are disconnected. In this case, the grounding voltage allows the first interface 121 of the switching circuit to be conducted with the second interface 122 of the switching circuit.

For example, as shown in FIG. 2, the circuit structure 100 provided by an embodiment of the present disclosure further includes a diode 170. A first end of the diode 170 is connected with the control end of the control circuit 110, and a second end of the diode 170 is connected with the driving power line 150, so that the driving power line 150 is connected with the control end 113 of the control circuit 110 through the diode 170. The diode 170 can ensure the current on the driving power line 150 to unidirectional and prevent backflow of the current when the circuit is abnormal.

Figure 3:
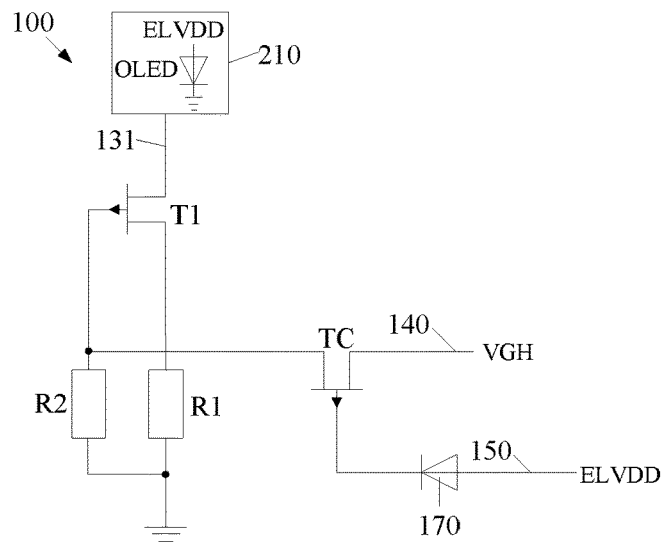
FIG. 3 is a third schematic diagram of a circuit structure provided by an embodiment of the present disclosure.

For example, as shown in FIG. 3, in a circuit structure 100 provided by an embodiment of the present disclosure, the switching circuit 120 includes a first transistor T1; and the first interface 121, the second interface 122 and the control interface 123 of the switching circuit 120 respectively include a first electrode, a second electrode and a gate electrode of the first transistor T1. The control circuit 110 includes a control transistor TC; and the first end 111, the second end 112 and the control end 113 of the control circuit 110 respectively include a first electrode, a second electrode and a gate electrode of the control transistor TC. The data-line group 130 includes a first data line 131; the first electrode of the first transistor T1 is connected with the first data line 131; the gate electrode of the first transistor T1 is connected with the second electrode of the control transistor TC; the gate electrode of the first transistor T1, for example, is grounded through the second resistor R2; the second electrode of the first transistor T1 is grounded, for example, the second electrode of the first transistor T1 is grounded through the first resistor R1. The first electrode of the control transistor TC is connected with the first voltage line 140, and the gate electrode of the control transistor TC is connected with the driving power line 150. For example, the gate electrode of the control transistor TC is connected with the driving power line 150 through the diode 170.

It should be noted that the circuit structure shown in FIG. 3 is a specific implementation approach of the circuit structure shown in FIG. 1 or FIG. 2, and the embodiments of the present disclosure include, but are not limited thereto.

Figure 4:
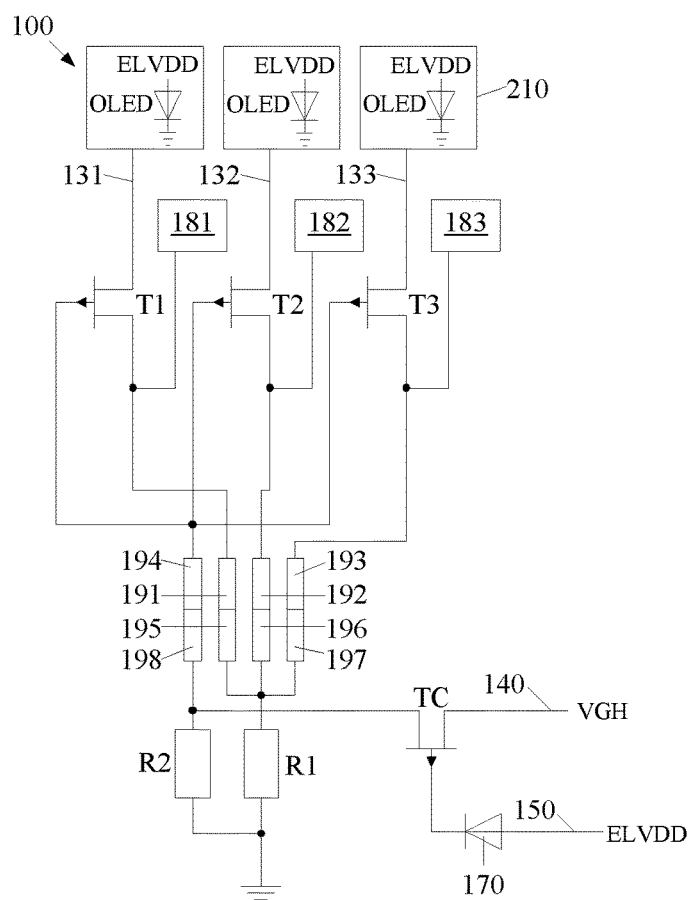
FIG. 4 is a fourth schematic diagram of a circuit structure provided by an embodiment of the present disclosure.

For example, as shown in FIG. 4, in a circuit structure 100 provided by an embodiment of the present disclosure, the switching circuit 120 includes the first transistor T1, a second transistor T2 and a third transistor T3. The first interface 121 of the switching circuit 120 includes a first electrode of the first transistor T1, a first electrode of the second transistor T2 and a first electrode of the third transistor T3; the second interface 122 of the switching circuit 120 includes a second electrode of the first transistor T1, a second electrode of the second transistor T2 and a second electrode of the third transistor T3; and the control interface 123 of the switching circuit 120 includes a gate electrode of the first transistor T1, a gate electrode of the second transistor T2 and a gate electrode of the third transistor T3. The control circuit 110 includes a control transistor TC; and the first end 111, the second end 112 and the control end 113 of the control circuit 110 respectively include a first electrode, a second electrode and a gate electrode of the control transistor TC. The data-line group 130 includes a first data line 131, a second data line 132 and a third data line 133. The first electrode of the first transistor T1 is connected with the first data line 131; the gate electrode of the first transistor T1 is connected with the second electrode of the control transistor TC, and may also be grounded through the second resistor R2; and the second electrode of the first transistor T1 is grounded (for example, the second electrode of the first transistor T1 is grounded through the first resistor R1). The first electrode of the second transistor T2 is connected with the second data line 132; the gate electrode of the second transistor T2 is connected with the second electrode of the control transistor TC, and may also be grounded through the second resistor R2; and the second electrode of the second transistor T2 is grounded (for example, the second electrode of the second transistor T2 is grounded through the first resistor R1). The first electrode of the third transistor T3 is connected with the third data line 133; the gate electrode of the third transistor T3 is connected with the second electrode of the control transistor TC, and may also be grounded through the second resistor R2; and the second electrode of the third transistor T3 is grounded (for example, the second electrode of the third transistor T3 is grounded through the first resistor R1). In other words, the gate electrode of the first transistor T1, the gate electrode of the second transistor T2 and the gate electrode of the third transistor T3 are all connected with the second electrode of the control transistor TC; and the gate electrode of the first transistor T1, the gate electrode of the second transistor T2 and the gate electrode of the third transistor T3 are also respectively connected with the grounded second resistor R2. The first electrode of the control transistor TC is connected with the first voltage line 140, and the gate electrode of the control transistor TC is connected with the driving power line 150 (for example, the gate electrode of the control transistor TC is connected with the driving power line 150 through the diode 170).

For example, in the circuit structure 100 provided by an embodiment of the present disclosure, the first transistor T1, the second transistor T2, the third transistor T3 and the control transistor TC are all thin film transistors. For example, the first transistor T1, the second transistor T2 and the third transistor T3 are all transistors conducted under a low voltage, and the control transistor TC is a transistor conducted under a high voltage. For example, in the circuit structure 100 provided by an embodiment of the present disclosure, the first transistor T1, the second transistor T2 and the third transistor T3 are all P-type transistors, and the control transistor TC is an N-type transistor.

It should be noted that the transistors adopted in the embodiments of the present disclosure may be thin film transistors or field effect transistors or switching devices with the same characteristics. A source electrode and a drain electrode of a transistor adopted herein may be structurally symmetric, and thus, the source electrode and the drain electrode of the transistor may have no difference in structure. In the embodiments of the present disclosure, in order to distinguish two electrodes of the transistor from the gate electrode, one electrode is directly described as the first electrode, and the other electrode is directly described as the second electrode, and thus, the first electrodes and the second electrodes of all or part of the transistors in the embodiments of the present disclosure can be exchanged as needed. For example, the first electrode of a transistor according to the embodiments of the present disclosure may be a source electrode, and the second electrode may be a drain electrode; or, the first electrode of the transistor is the drain electrode, and the second electrode is the source electrode. Moreover, according to different characteristics of the transistors, the transistors may be divided into the N-type transistors and P-type transistors. The embodiments of the present disclosure are illustrated by taking a case that the first transistor T1, the second transistor T2 and the third transistor T3 are all the P-type transistors and the control transistor TC is the N-type transistor as an example. Based on the description and guidance of implementations of the present disclosure, those skilled in the art, without any inventive work, may easily think of that other implementation approaches using different combination of transistors can be achieved in the embodiments of the disclosure, and thus, those implementation approaches should also fall within the scope of the present disclosure.

For example, when a high-level voltage (e.g., 5V or other values) is applied to the gate electrode of the N-type transistor, the first electrode and the second electrode of the N-type transistor are conducted; and when a low-level voltage (e.g., 0V or other values) is applied to the gate electrode of the N-type transistor, the first electrode and the second electrode of the N-type transistor are disconnected. When a high-level voltage (e.g., 5V) is applied to the gate electrode of the P-type transistor, the first electrode and the second electrode of the P-type transistor are disconnected; and when a low-level voltage (e.g., 0V or other values) is applied to gate electrode of the P-type transistor, the first electrode and the second electrode of the P-type transistor are conducted. Therefore, the first voltage VGH, for example, is a high-level voltage, and the driving power voltage ELVDD, for example, is a high-level voltage, so that the circuit structure can achieve a function of avoiding the splash screen phenomenon. It is noteworthy that the high-level voltage and the low-level voltage may be any proper voltage levels, the high-level voltage is relative to the low-level voltage, and a value of the high-level voltage is higher than a value of the low-level voltage.

For example, as shown in FIG. 4, the circuit structure 100 provided by an embodiment of the present disclosure further includes the first resistor R1, a first test pad 181, a second test pad 182 and a third test pad 183. The first test pad 181 is connected with the second electrode of the first transistor T1 and the first end of the first resistor R1; the second test pad 182 is connected with the second electrode of the second transistor T2 and the first end of the first resistor R1; the third test pad 183 is connected with the second electrode of the third transistor T3 and the first end of the first resistor R1; and the second end of the first resistor R1 is grounded. For example, the first test pad 181, the second test pad 182 and the third test pad 183 can be respectively used for testing whether the organic light emitting diode OLED in the pixel circuit 210 of the display panel emits light normally.

For example, as shown in FIG. 4, the circuit structure 100 provided by an embodiment of the present disclosure further includes: a first pin 191, a second pin 192, a third pin 193, a fourth pin 194, a fifth pin 195 connected with the first pin 191, a sixth pin 196 connected with the second pin 192, a seventh pin 197 connected with the third pin 193, and an eighth pin 198 connected with the fourth pin 194. The first pin 191 is connected with the second electrode of the first transistor T1; the second pin 192 is connected with the second electrode of the second transistor T2; the third pin 193 is connected with the second electrode of the third transistor T3; the fourth pin 194 is connected with the gate electrode of the first transistor T1, the gate electrode of the second transistor T2 and the gate electrode of the third transistor T3; the fifth pin 195, the sixth pin 196 and the seventh pin 197 are all grounded, and for example, the fifth pin 195, the sixth pin 196 and the seventh pin 197 are all grounded through the first resistor R1; and the eighth pin 198 is connected with the second electrode of the control transistor TC, and for example, the eighth pin 198 is grounded through the second resistor R2.

For example, in connection with FIG. 2 and FIG. 4, the second interface 122 of the switching circuit 120 may further includes the first pin 191, the second pin 192 and the third pin 193. The first pin 191, the second pin 192 and the third pin 193 are electrically connected with the fifth pin 195, the sixth pin 196 and the seventh pin 197 respectively; and the fifth pin 195, the sixth pin 196 and the seventh pin 197 are all grounded through the first resistor R1. The control interface 123 of the switching circuit 120 may further include the fourth pin 194, the second end 112 (for example, the second electrode of the control transistor TC) of the control circuit 110 may also include the eighth pin 198; and in FIG. 2, the connection between the control interface 123 of the switching circuit 120 and the second end 112 of the control circuit 110 may be implemented by an electrical connection between the fourth pin 194 and the eighth pin 198.

It should be noted that the circuit structure shown in FIG. 4 is a specific implementation approach of the circuit structure shown in FIG. 1 or FIG. 2, and the embodiments of the present disclosure include, but are not limited thereto.

Figure 5:
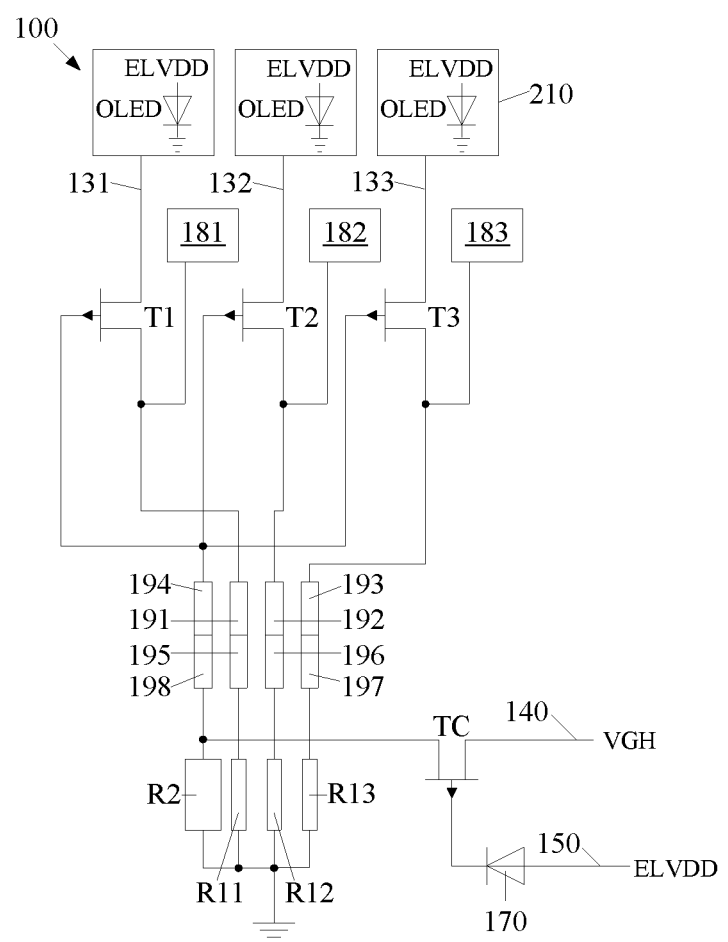
FIG. 5 is a fifth schematic diagram of a circuit structure provided by an embodiment of the present disclosure.

For example, as shown in FIG. 5, a circuit structure 100 provided by an embodiment of the present disclosure further includes a third resistor R11, a fourth resistor R12, a fifth resistor R13, a first test pad 181, a second test pad 182 and a third test pad 183. The first test pad 181 is connected with the second electrode of the first transistor T1 and a first end of the third resistor R11; the second test pad 182 is connected with the second electrode of the second transistor T2 and a first end of the fourth resistor R12; the third test pad 183 is connected with the second electrode of the third transistor T3 and a first end of the fifth resistor R13; and a second end of the third resistor R11, a second end of the fourth resistor R12 and a second end of the fifth resistor R13 are all grounded. For example, the first test pad 181, the second test pad 182 and the third test pad 183 may be used for testing whether the organic light emitting diode OLED in the pixel circuit 210 of the display panel emits light normally. For example, the first test pad 181 is used for testing a red OLED, the second test pad 182 is used for testing a green OLED, and the third test pad 183 is used for testing a blue OLED. For example, when the red OLED needs to be tested, a light emitting data voltage is applied to the first test pad 181, the first electrode and the second electrode of the first transistor T1 are conducted, and then whether the red OLED emits light normally is observed. For example, when the green OLED needs to be tested, a light emitting data voltage is applied to the second test pad 182, the first electrode and the second electrode of the second transistor T2 are conducted, and then whether the green OLED emits light normally is observed. For example, when the blue OLED needs to be tested, a light emitting data voltage is applied to the third test pad 183, the first electrode and the second electrode of the third transistor T3 are conducted, and then whether the blue OLED emits light normally is observed. Such configuration may be used to implement separate testing and/or simultaneous testing of three colors of OLEDs, and is beneficial for evaluating product performance and controlling a production process.

For example, as shown in FIG. 5, the circuit structure 100 provided by an embodiment of the present disclosure further includes: a first pin 191, a second pin 192, a third pin 193, a fourth pin 194, a fifth pin 195 connected with the first pin 191, a sixth pin 196 connected with the second pin 192, a seventh pin 197 connected with the third pin 193, and an eighth pin 198 connected with the fourth pin 194. The first pin 191 is connected with the second electrode of the first transistor T1; the second pin 192 is connected with the second electrode of the second transistor T2; the third pin 193 is connected with the second electrode of the third transistor T3; the fourth pin 194 is connected with the gate electrode of the first transistor T1, the gate electrode of the second transistor T2 and the gate electrode of the third transistor T3; the fifth pin 195, the sixth pin 196 and the seventh pin 197 are all grounded (for example, the fifth pin 195 is grounded through the third resistor R11, the sixth pin 196 is grounded through the fourth resistor R12, and the seventh pin 197 is grounded through the fifth resistor R13); and the eighth pin 198 is connected with the second electrode of the control transistor TC, and the eighth pin 198 may also be grounded through the second resistor R2.

Description for similar parts of the circuit structure shown in FIG. 5 and the circuit structure shown in FIG. 4 are not repeated herein.

It should be noted that the circuit structure shown in FIG. 5 is a specific implementation approach of the circuit structure shown in FIG. 1 or FIG. 2, and the embodiments of the present disclosure include, but are not limited thereto.

Figure 6:
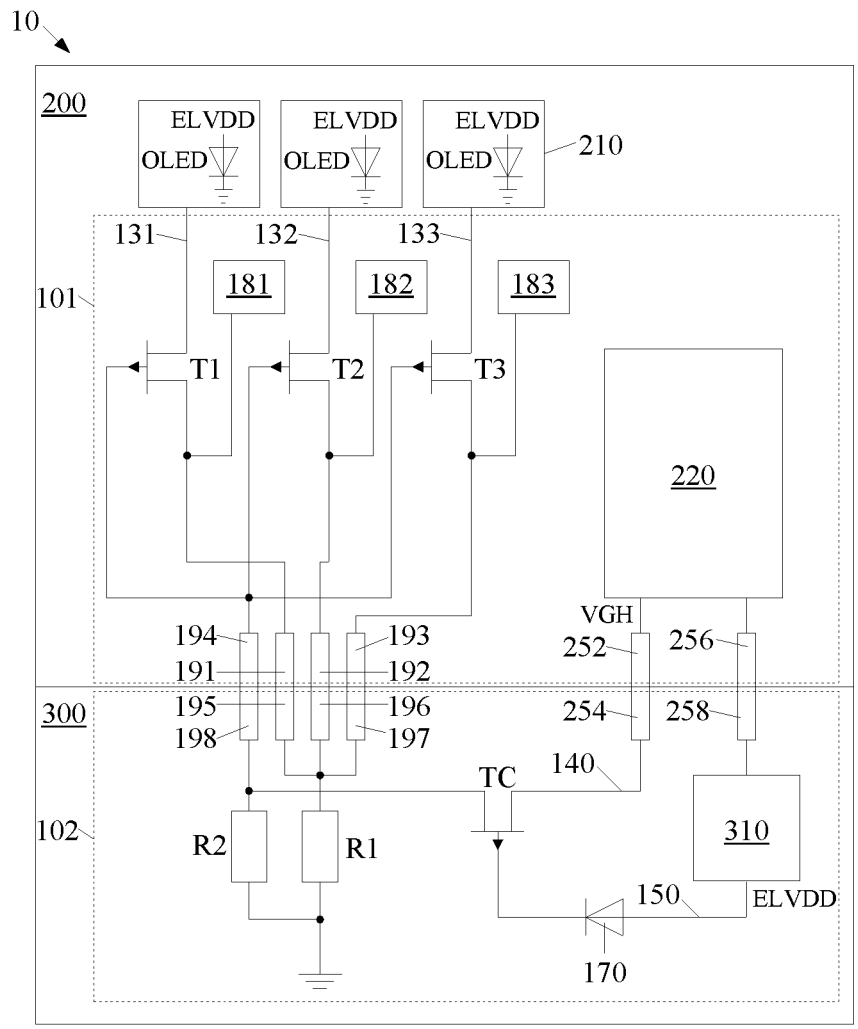
FIG. 6 is a schematic diagram of a display device provided by an embodiment of the present disclosure.

An embodiment of the present disclosure further provides a display device 10. As shown in FIG. 6, the display device 10 includes the circuit structure 100 provided by any embodiment of the present disclosure.

For example, the display device 10 provided by an embodiment of the present disclosure includes a display panel 200 and a circuit board 300, and the circuit structure 100 may be arranged on the display panel 200 or the circuit board 300.

For example, the circuit board 300 may be a flexible circuit board. Adoption of the flexible circuit board can reduce a volume and a weight of the display device, and is convenient for product design.

For example, as shown in FIG. 6, in the display device 10 provided by an embodiment of the present disclosure, a first portion 101 of the circuit structure 100 may be arranged on the display panel 200, a second portion 102 of the circuit structure 100 may be arranged on the circuit board 300. The first portion 101 of the circuit structure 100, for example, may include components including the switching circuit 120, the data-line group 130 and the like, and the second portion 102 of the circuit structure 100 may include components including the control circuit 110 and the like.

For example, in the display device 10 provided by an embodiment of the present disclosure, the first portion 101 of the circuit structure 100 and the second portion 102 of the circuit structure 100 are connected through a plurality of pins arranged in a bonding region. For example, the first portion 101 of the circuit structure 100 and the second portion 102 of the circuit structure 100 are connected through the pins 191 to 198. For example, the bonding region is a region formed at the edge of the display panel and/or the edge of the circuit board and is used for circuit connection.

For example, in the display device 10 provided by an embodiment of the present disclosure, the display panel further includes a driving circuit 220, and the driving circuit 220 is configured to provide a first voltage VGH to the first voltage line 140. For example, the first voltage line 140 and the driving circuit 220 are connected through two pins 252 and 254 in the bonding region.

For example, in the display device 10 provided by an embodiment of the present disclosure, the circuit board 300 further includes a direct current transformer 310, and the direct current transformer 310 is respectively connected with the driving circuit 220 and the driving power line 150 and is configured to provide a driving power voltage ELVDD to the driving power line 150. For example, the direct current transformer 310 and the driving circuit 220 are connected through two pins 256 and 258 in the bonding region.

For example, the display device provided by embodiments of the present disclosure may include any product or part with a display function, e.g., a mobile phone, a tablet personal computer, a television, a display, a notebook computer, a digital photo frame, a navigator and the like.

Figure 7:
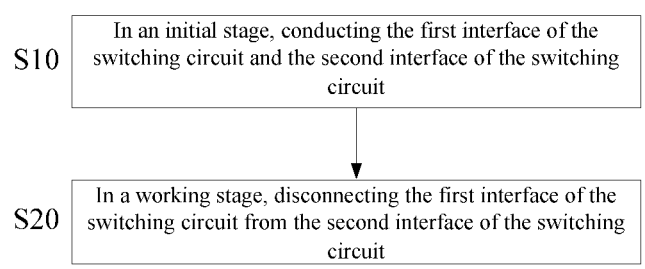
FIG. 7 is a flow chart of a method for driving a circuit structure provided by an embodiment of the present disclosure, with the circuit structure being provided by any embodiment of the present disclosure.

An embodiment of the present disclosure further provides a method for driving a circuit structure 100 that can be any circuit structure provided by any embodiment of the disclosure. As shown in FIG. 7, the method includes the following steps.

Step S10: In an initial stage, conducting the first interface 121 of the switching circuit 120 to the second interface 122 of the switching circuit 120, so that the data-line group 13 is grounded through the switching circuit 120; and Step S20: In a working stage, disconnecting the first interface 121 of the switching circuit 120 from the second interface 122 of the switching circuit 120.

For example, the initial stage is a stage in which the organic light emitting diode OLED in the pixel circuit 210 of the display panel does not emit light; and the working stage is a stage in which the organic light emitting diode OLED in the pixel circuit 210 of the display panel emits light.

For example, in the method provided by an embodiment of the present disclosure, in the initial stage, conducting the first interface 121 of the switching circuit 120 to the second interface 122 of the switching circuit 120 includes: disconnecting the first end 111 of the control circuit 110 from the second end 112 of the control circuit 110 so as to control a voltage applied to the control interface 123 of the switching circuit 120 to be a switch opening voltage (the switch opening voltage, for example, is a voltage capable of conducting the first interface 121 of the switching circuit 120 to the second interface 122 of the switching circuit 120, and for example, is a low-level voltage). Under the control of the switch opening voltage, the first interface 121 of the switching circuit 120 and the second interface 122 of the switching circuit 120 are conducted, so that the data-line group 130 is grounded through the switching circuit 120. In the working stage, disconnecting the first interface 121 of the switching circuit 120 from the second interface 122 of the switching circuit 120 includes: conducting the first end 111 of the control circuit 110 to the second end 112 of the control circuit 110, so that the control circuit 110 can provide a first voltage VGH to the control interface 123 of the switching circuit 120 (the first voltage VGH, for example, is a voltage capable of disconnecting the first interface 121 of the switching circuit 120 from the second interface 122 of the switching circuit 120, and for example, is a high-level voltage of 5V). Under the control of the first voltage VGH, the switching circuit 120 may disconnect the first interface 121 from the second interface 122.

For example, in the method provided by an embodiment of the present disclosure, in the initial stage, disconnecting the first end 111 of the control circuit 110 from the second end 112 of the control circuit 110 includes: providing a closing voltage to the control end 113 of the control circuit 110 (the closing voltage, for example, is a voltage capable of disconnecting the first end 111 of the control circuit 110 from the second end 112 of the control circuit 110, and for example, is a low-level voltage of 0V), so as to disconnect the first end 111 of the control circuit 110 from the second end 112 of the control circuit 110. In the working stage, conducting the first end 111 of the control circuit 110 and the second end 112 of the control circuit 110 includes: providing a driving power voltage ELVDD to the control end 113 of the control circuit 110 (the driving power voltage ELVDD, for example, is a voltage capable of conducting the first end 111 of the control circuit 110 and the second 112 of the control circuit 110, and for example, is a high-level voltage of 5V), so as to conduct the first end 111 of the control circuit 110 and the second end 112 of the control circuit 110.

Embodiments of the present disclosure provide a circuit structure, a display device and a driving method. By modifying voltages on data lines before the display device normally works, for example, enabling the voltages on the data lines to be the grounded voltage (e.g., 0V) in the initial stage, the splash screen phenomenon caused by abnormality of the voltages on the data lines in the power-on process is avoided. Meanwhile, by utilizing the existing first voltage VGH and driving power voltage ELVDD in the display panel or the display device, a solution of solving the splash screen phenomenon can be achieved without additionally adding a driving signal or modifying the driving circuit or a driving sequence.

Although the disclosure has been described above in details with general descriptions and specific embodiments, on the basis of the embodiments of the disclosure, various changes and improvements may be made, which is apparent to those skilled in the art. Therefore, all such changes and improvements without departing from the spirit of the disclosure are within the scope of the claims of the disclosure. Therefore, the scope of the present disclosure is determined by the scope of the claims.

The present application claims the priority of the Chinese Patent Application No. 201610698311.9 filed on Aug. 19, 2016, which is incorporated herein by reference in its entirety as part of the disclosure of the present application.

The invention claimed is:

1. A circuit structure, comprising:
   a control circuit, including a first end, a second end and a control end;
   a switching circuit, including a first interface, a second interface and a control interface, wherein the control interface of the switching circuit is connected with the second end of the control circuit, and the second interface of the switching circuit is grounded;
   a data-line group, connected with the first interface of the switching circuit;
   a driving power line, connected with the control end of the control circuit and configured to provide a driving power voltage in a working stage to conduct the first end of the control circuit and the second end of the control circuit; and
   a first voltage line, connected with the first end of the control circuit and configured to, when the first end of the control circuit and the second end of the control circuit are conducted, provide a first voltage to the control interface of the switching circuit through the control circuit to disconnect the first interface of the switching circuit from the second interface of the switching circuit.

2. The circuit structure according to claim 1, wherein the data-line group is further connected with a pixel circuit in a display panel, and the driving power voltage is further configured to drive an organic light emitting diode in the pixel circuit of the display panel to emit light in the working stage.

3. The circuit structure according to claim 1, further comprising a first resistor, wherein the second interface of the switching circuit is connected with a first end of the first resistor, and a second end of the first resistor is grounded, so that the switching circuit is grounded through the first resistor.

4. The circuit structure according to claim 1, further comprising a second resistor, wherein a first end of the second resistor is simultaneously connected with the control interface of the switching circuit and the second end of the control circuit, and a second end of the second resistor is grounded.

5. The circuit structure according to claim 1, further comprising a diode, wherein a first end of the diode is connected with the control end of the control circuit, and a second end of the diode is connected with the driving power line, so that the driving power line is connected with the control end of the control circuit through the diode.

6. The circuit structure according to claim 1, wherein:
   the switching circuit includes a first transistor, and the first interface, the second interface and the control interface of the switching circuit respectively include a first electrode, a second electrode and a gate electrode of the first transistor;
   the control circuit includes a control transistor, and the first end, the second end and the control end of the control circuit respectively include a first electrode, a second electrode and a gate electrode of the control transistor;
   the data-line group includes a first data line;
   the first electrode of the first transistor is connected with the first data line, the gate electrode of the first transistor is connected with the second electrode of the control transistor, and the second electrode of the first transistor is grounded; and
   the first electrode of the control transistor is connected with the first voltage line, and the gate electrode of the control transistor is connected with the driving power line.

7. The circuit structure according to claim 1, wherein:
   the switching circuit includes a first transistor, a second transistor and a third transistor, the first interface of the switching circuit includes a first electrode of the first transistor, a first electrode of the second transistor and a first electrode of the third transistor, the second interface of the switching circuit includes a second electrode of the first transistor, a second electrode of the second transistor and a second electrode of the third transistor, and the control interface of the switching circuit includes a gate electrode of the first transistor, a gate electrode of the second transistor and a gate electrode of the third transistor;
   the control circuit includes a control transistor, and the first end, the second end and the control end of the control circuit respectively include a first electrode, a second electrode and a gate electrode of the control transistor;

the data-line group includes a first data line, a second data line and a third data line;

the first electrode of the first transistor is connected with the first data line, the gate electrode of the first transistor is connected with the second electrode of the control transistor, and the second electrode of the first transistor is grounded;

the first electrode of the second transistor is connected with the second data line, the gate electrode of the second transistor is connected with the second electrode of the control transistor, and the second electrode of the second transistor is grounded;

the first electrode of the third transistor is connected with the third data line, the gate electrode of the third transistor is connected with the second electrode of the control transistor, and the second electrode of the third transistor is grounded; and the first electrode of the control transistor is connected with the first voltage line, and the gate electrode of the control transistor is connected with the driving power line.

8. The circuit structure according to claim 7, wherein the first transistor, the second transistor, the third transistor and the control transistor are thin film transistors.

9. The circuit structure according to claim 8, wherein the first transistor, the second transistor and the third transistor are P-type transistors, and the control transistor is an N-type transistor.

10. The circuit structure according to claim 7, further comprising a first resistor, a first test pad, a second test pad and a third test pad, wherein:

the first test pad is connected with the second electrode of the first transistor and a first end of the first resistor;

the second test pad is connected with the second electrode of the second transistor and the first end of the first resistor;

the third test pad is connected with the second electrode of the third transistor and the first end of the first resistor; and a second end of the first resistor is grounded.

11. The circuit structure according to claim 7, further comprising a third resistor, a fourth resistor, a fifth resistor, a first test pad, a second test pad and a third test pad, wherein:

the first test pad is connected with the second electrode of the first transistor and a first end of the third resistor;

the second test pad is connected with the second electrode of the second transistor and a first end of the fourth resistor;

the third test pad is connected with the second electrode of the third transistor and a first end of the fifth resistor; and a second end of the third resistor, a second end of the fourth resistor and a second end of the fifth resistor are grounded.

12. The circuit structure according to claim 7, further comprising:

a first pin, a second pin, a third pin, a fourth pin, a fifth pin connected with the first pin, a sixth pin connected with the second pin, a seventh pin connected with the third pin, and an eighth pin connected with the fourth pin, wherein:

the first pin is connected with the second electrode of the first transistor;

the second pin is connected with the second electrode of the second transistor;

the third pin is connected with the second electrode of the third transistor;

the fourth pin is connected with the gate electrode of the first transistor, the gate electrode of the second transistor and the gate electrode of the third transistor;

the fifth pin, the sixth pin and the seventh pin are grounded; and the eighth pin is connected with the second electrode of the control transistor.

13. A display device, comprising the circuit structure according to claim 1.

14. The display device according to claim 13, comprising a display panel and a circuit board, wherein the circuit structure is arranged on the display panel or the circuit board.

15. The display device according to claim 13, comprising a display panel and a circuit board, wherein a first portion of the circuit structure is arranged on the display panel, a second portion of the circuit structure is arranged on the circuit board, the first portion of the circuit structure includes the switching circuit and the data-line group, and the second portion of the circuit structure includes the control circuit.

16. The display device according to claim 15, wherein the first portion of the circuit structure and the second portion of the circuit structure are connected through a plurality of pins arranged in a bonding region.

17. The display device according to claim 13, wherein:

the display panel includes a driving circuit, the driving circuit is configured to provide a first voltage to the first voltage line; and the circuit board includes a direct current transformer, and the direct current transformer is respectively connected with the driving circuit and the driving power line and is configured to provide the driving power voltage to the driving power line.

18. A method for driving the circuit structure according to claim 1, comprising:

in an initial stage, conducting the first interface of the switching circuit and the second interface of the switching circuit, so that the data-line group is grounded through the switching circuit; and in a working stage, disconnecting the first interface of the switching circuit from the second interface of the switching circuit.

19. The method according to claim 18, wherein:

in the initial stage, conducting the first interface of the switching circuit and the second interface of the switching circuit includes: disconnecting the first end of the control circuit from the second end of the control circuit to control a voltage applied to the control interface of the switching circuit to be a switch opening voltage, wherein under control of the switch opening voltage, the first interface of the switching circuit and the second interface of the switching circuit are conducted, so that the data-line group is grounded through the switching circuit; and in the working stage, disconnecting the first interface of the switching circuit from the second interface of the switching circuit includes: conducting the first end of the control circuit and the second end of the control circuit so as to provide a first voltage to the control interface of the switching circuit, wherein under control of the first voltage, the switching circuit disconnects the first interface of the switching circuit from the second interface of the switching circuit.

20. The method according to claim 19, wherein:
in the initial stage, disconnecting the first end of the control circuit from the second end of the control circuit includes: providing a closing voltage to the control end of the control circuit so as to disconnect the first end of the control circuit from the second end of the control circuit; and
in the working stage, conducting the first end of the control circuit and the second end of the control circuit includes: providing a driving power voltage to the control end of the control circuit so as to conduct the first end of the control circuit and the second end of the control circuit.

\* \* \* \* \*